United States Patent
Song et al.

(10) Patent No.: US 10,707,241 B2
(45) Date of Patent: Jul. 7, 2020

(54) ARRAY SUBSTRATE AND DISPLAY PANEL

(71) Applicants: Boe Technology Group Co Ltd., Beijing (CN); Boe (Hebei) Mobile Display Technology Co., Ltd, Hebei (CN)

(72) Inventors: Yuesheng Song, Beijing (CN); He Xu, Beijing (CN); Donglai Gao, Beijing (CN); Wenbo Wang, Beijing (CN); Feng Guan, Beijing (CN)

(73) Assignees: BOE TECHNOLOGY GROUP CO., LTD., Beijing (CN); BOE (HEBEI) MOBILE DISPLAY TECHNOLOGY CO., LTD., Hebei (CN)

( * ) Notice: Subject to any disclaimer, the term of this patent is extended or adjusted under 35 U.S.C. 154(b) by 0 days.

(21) Appl. No.: 16/150,497

(22) Filed: Oct. 3, 2018

(65) Prior Publication Data
US 2019/0148408 A1    May 16, 2019

(30) Foreign Application Priority Data
Nov. 15, 2017 (CN) .......................... 2017 1 1131501

(51) Int. Cl.
*H01L 27/12* (2006.01)
*H01L 23/00* (2006.01)
*G02F 1/1345* (2006.01)

(52) U.S. Cl.
CPC ............ *H01L 27/124* (2013.01); *H01L 24/09* (2013.01); *H01L 27/1262* (2013.01); *G02F 1/13458* (2013.01)

(58) Field of Classification Search
CPC ... H01L 27/124; H01L 24/09; H01L 27/1262; H01L 2224/73204; H01L 2224/81903;
(Continued)

(56) References Cited

U.S. PATENT DOCUMENTS 9,575,386 B2     2/2017  Choi et al.
2005/0264503 A1* 12/2005 Wu ........................ G09G 3/006
                                                                  345/87
(Continued)

FOREIGN PATENT DOCUMENTS

CN           1967836 A        5/2007
CN         101000413 A        7/2007
(Continued)

OTHER PUBLICATIONS

First Office Action for Chinese Patent Application No. 201711131501.3 dated Dec. 10, 2019.
(Continued)

*Primary Examiner* — William F Kraig
*Assistant Examiner* — Vicki B. Booker
(74) *Attorney, Agent, or Firm* — Calfee, Halter & Griswold LLP

(57) ABSTRACT

An array substrate having a substrate with a bonding region on one side, the bonding region having a plurality of bonding pads arranged in order, where at least one dummy pad is provided in a first position of the bonding pads. The at least one dummy pad is used for dividing the bonding region into a plurality of bonding sub-regions, where each bonding sub-region has a plurality of bonding pads. This disclosure further provides a display panel.

16 Claims, 1 Drawing Sheet

(58) Field of Classification Search
CPC . H01L 2224/16227; H01L 2224/32225; H01L 24/32; H01L 24/16; H01L 2224/83851; G02F 1/13458; G02F 1/1345
See application file for complete search history.

(56) References Cited

U.S. PATENT DOCUMENTS

| | | | |
|---|---|---|---|
| 2007/0040286 A1* | 2/2007 | Liu | H01L 23/544 257/797 |
| 2007/0114652 A1 | 5/2007 | Hsieh | |
| 2007/0164948 A1* | 7/2007 | Kim | G09G 3/3611 345/87 |
| 2011/0003487 A1 | 1/2011 | Xiang et al. | |
| 2012/0105085 A1* | 5/2012 | Chen | G02F 1/1309 324/693 |
| 2015/0262897 A1* | 9/2015 | Chen | H01L 22/32 257/48 |
| 2015/0264805 A1* | 9/2015 | Chen | H05K 3/0052 361/748 |
| 2016/0086911 A1 | 3/2016 | Suzuki | |
| 2017/0048988 A1 | 2/2017 | Wang et al. | |
| 2017/0164478 A1 | 6/2017 | Lee | |

FOREIGN PATENT DOCUMENTS

| | | |
|---|---|---|
| CN | 101521984 A | 9/2009 |
| CN | 203151861 U | 8/2013 |
| CN | 104661430 A | 5/2015 |
| CN | 204335152 U | 5/2015 |
| CN | 206353887 U | 7/2017 |
| CN | 107015407 A | 8/2017 |
| KR | 20070048376 A | 5/2007 |
| KR | 20110005573 A | 10/2011 |

OTHER PUBLICATIONS

Second Office Action for Chinese Patent Application No. 201711131501.3 dated May 12, 2020.

* cited by examiner

ARRAY SUBSTRATE AND DISPLAY PANEL

RELATED APPLICATION

The present application claims the benefit of Chinese Patent Application No. 201711131501.3, filed on Nov. 15, 2017, the entire disclosure of which is incorporated herein by reference.

TECHNICAL FIELD

This disclosure relates to the field of display technologies, and in particular to an array substrate and a display panel.

BACKGROUND ART

As the requirement for display effects of displays becomes higher and higher in recent years, the number of pixels comprised in a liquid crystal display per inch is increased continuously, which requires more pixels to be arranged per unit area on a display panel of the display and thus more wires.

In related technologies, an array substrate of the liquid crystal display has a bonding region on the periphery of a display region, the bonding region comprising a plurality of bonding pads arranged in order. Each bonding pad has data lines or signal lines for connecting to an integrated circuit module so as to control the display of the liquid crystal display.

SUMMARY

According to one exemplary embodiment of this disclosure, an array substrate is provided, comprising: a substrate, the substrate having a bonding region on one side, the bonding region comprising a plurality of bonding pads arranged in order, wherein at least one dummy pad is provided in a first position of the bonding pads, the at least one dummy pad dividing the bonding region into a plurality of bonding sub-regions, each bonding sub-region comprising a plurality of bonding pads.

In one embodiment, the number of bonding pads comprised in each bonding sub-region is the same.

In one embodiment, each dummy pad has a label.

In one embodiment, the label is used for indicating the number of bonding pads comprised in a bonding sub-region corresponding to the dummy pad.

In one embodiment, the label is used for indicating a serial number of a bonding sub-region corresponding to the dummy pad.

In one embodiment, the number of bonding pads comprised in each bonding sub-region is 40-50.

In one embodiment, a plurality of bonding pads are arranged sequentially in a plurality of horizontal rows parallel with each other, the dummy pad in each horizontal row and the corresponding dummy pads in other horizontal rows being located in a same vertical column.

According to another exemplary embodiment of this disclosure, a touch panel is further provided, comprising any array substrate mentioned above.

DETAILED DESCRIPTION OF EMBODIMENTS

Specific implementations, structures, features and other effects of the array substrate and the display panel will be explained in detail with reference to the drawings and the embodiments. In the following, "one embodiment" or "embodiments" mentioned in different places do not necessarily refer to the same embodiment(s). Besides, special features or structures in one or more embodiments can be combined in any suitable form.

Figure 1:
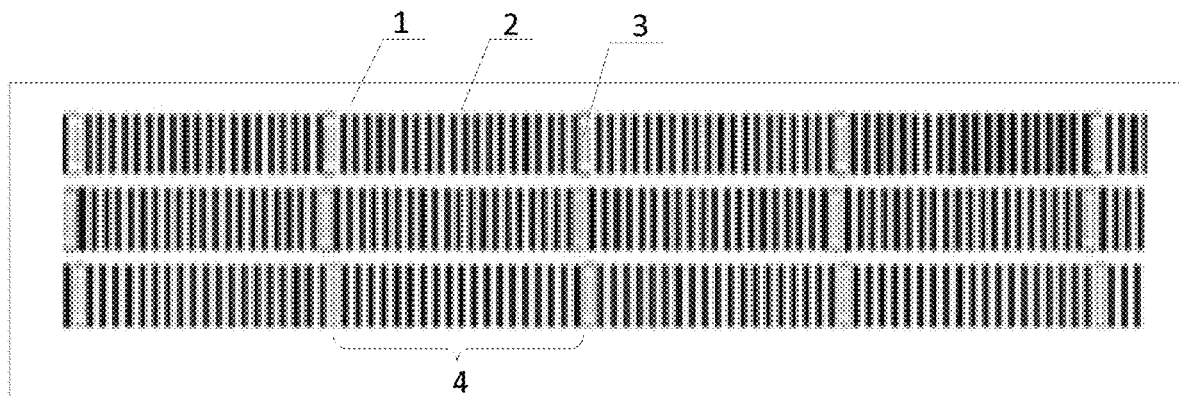
FIG. 1 is a schematic structure view of the array substrate according to an embodiment of this disclosure.
Figure 2:
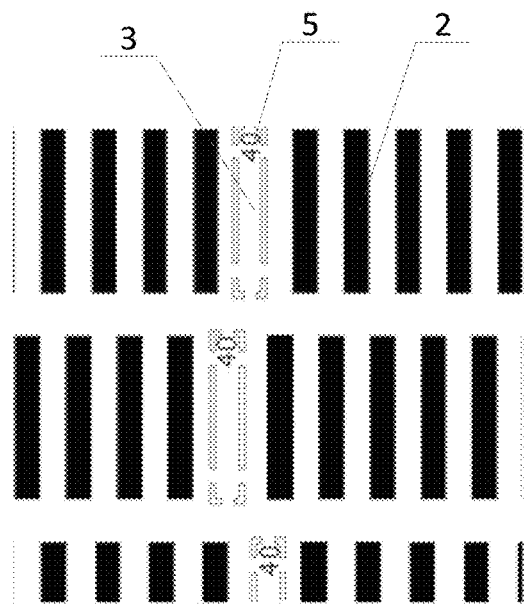
FIG. 2 is an enlarged view of a portion of the array substrate according to an embodiment of this disclosure.

As shown in FIG. 1, an array substrate is provided in an embodiment of this disclosure, comprising:

a substrate, the substrate having a bonding region 1 on one side, the bonding region 1 comprising a plurality of bonding pads 2 arranged in order, wherein at least one dummy pad 3 is provided in a first position of the bonding pads 2, the at least one dummy pad 3 dividing the bonding region 1 into a plurality of bonding sub-regions 4, each bonding sub-region 4 comprising a plurality of bonding pads 2.

An array substrate generally comprises an array region and a bonding region 1. The array region is an operation region of the array substrate, comprising signal lines such as gate lines, data lines and common electrode lines, and components such as pixel electrodes, common electrodes and thin film transistors (TFTs). The bonding region 1 is called a PAD region. The bonding region 1 is usually located on one side or two adjacent sides of four sides of the array substrate. The bonding region 1 is generally provided with only signal lines or data lines. The array substrate is interconnected with leads of an external drive circuit board via the signal lines or data lines provided in the bonding region 1.

The bonding region 1 can comprise a plurality of bonding pads 2, each bonding pad 2 being used for bonding a signal line. One end of each signal line is connected to an integrated circuit module on the array substrate corresponding to the pixels, and the other end is connected to the external drive circuit board. The plurality of bonding pads 2 within the bonding region 1 can be arranged in order, e.g., the plurality of bonding pads 2 can be arranged sequentially in a straight line; or the plurality of bonding pads 2 can be arranged sequentially in a plurality of straight lines parallel with each other. They can be specifically arranged in many different ways, which will not be limited herein. The bonding region 1 can comprise 300 to 400 bonding pads 2. Since the plurality of bonding pads 2 are all arranged in order, when the staff search for a fault of the display panel, they can first search for a bonding pad 2 of the bonding region 1 having trouble, and then search for the integrated circuit module corresponding to the bonding pad. However, if the bonding pads 2 in the bonding region 1 do not have labels, it will be troublesome for the staff to search for the bonding pad 2 having trouble. For example, when the staff need to search for the bonding pad 2 whose serial number is 150, they have to count from the bonding pad 2 whose serial number is 1 to the bonding pad 2 whose serial number is 150. Besides, since the bonding pads 2 within the bonding region 1 have very tiny specifications, the staff often have to count with the help of a microscope, which will easily give rise to counting errors, thereby affecting the accuracy of troubleshooting and reducing the efficiency of troubleshooting.

At least one dummy pad 3 is provided in a first position of the bonding pads 2. The number of the dummy pad 3 can be one or more, which will not be limited herein. The dummy pads 3 divide the bonding region 1 into a plurality of bonding sub-regions 4, wherein each bonding sub-region 4 comprises a plurality of bonding pads 2. For example, there are 320 bonding pads 2 in total, and a dummy pad 3 is provided every 40 bonding pads 2. When the staff need to search for the 150th bonding pad 2, they first determine that the bonding pad 2 to be searched for is within the fourth bonding sub-region 4, wherein serial numbers of the bonding pads within the fourth bonding sub-region 4 are 121 to 160. Then, the staff rapidly find the fourth bonding sub-region 4 via labels of the dummy pads 3, and count in the fourth bonding sub-region 4. By doing this, they can not only improve the speed of finding the bonding pad 2 to be searched for, but also ensure the accuracy of troubleshooting. The dummy pads 3 can be realized in many forms, e.g., they can be reserved interval space, or bonding pads with no signal lines being bound, or special identifiers, which will not be limited herein.

In related technologies, in case of display defects such as dark lines in a liquid crystal display, after the staff have confirmed the serial number of the bonding pads in the bonding region having trouble, they have to count a plurality of bonding pads arranged in order in the bonding region until they find the bonding pad with the corresponding serial number. This search manner has a low efficiency and requires a heavy workload of the staff. This disclosure provides an array substrate and a display panel for enabling the staff to rapidly find a bonding pad with a specific serial number within a bonding region of the array substrate.

This disclosure provides an array substrate for enabling the staff to rapidly find a bonding pad with a specific serial number within a bonding region of the array substrate. In related technologies, when the staff need to search for a bonding pad with a specific serial number within a bonding region of the array substrate, they usually have to count from the first bonding pad. This not only makes the troubleshooting procedure laborious and time-consuming, but also easily gives rise to counting errors, thereby resulting in a low efficiency of troubleshooting. The array substrate provided in this disclosure comprises: a substrate, the substrate having a bonding region on one side, the bonding region comprising a plurality of bonding pads arranged in order, wherein at least one dummy pad is provided in a first position of the bonding pads, the at least one dummy pad dividing the bonding region into a plurality of bonding sub-regions, each bonding sub-region comprising a plurality of bonding pads. When the staff need to search for a bonding pad with a specific serial number, they can first determine a bonding sub-region in which the bonding pad with the specific serial number is located, and then count within the bonding sub-region. This decreases the workload for counting, and thus reduces the time the staff spend searching for the bonding pad with the specific serial number within the bonding region of the array substrate and improves the efficiency of troubleshooting.

In addition, an IC bump and a cummy bump on the array substrate are usually connected via an anisotropic conductive film (ACF), and to determine whether the connection between the IC bump and the cummy bump is well conductive, one needs to observe a pressed state of conductive particles in the anisotropic conductive adhesive. In an embodiment provided in this disclosure, one can directly observe, via at least one dummy pad in a first position of the bonding pads, the pressed state of the conductive particles and whether the impression is stable, which can accelerate the working efficiency of the staff.

There can be a plurality of dummy pads 3, and the plurality of dummy pads 3 are arranged in a plurality of first positions of the bonding pads 2 respectively. There can be many bonding pads 2 in the bonding region 1 of the array substrate, generally 300-400. In order to improve the efficiency of searching for the bonding pad 2 with a specific serial number, a plurality of dummy pads 3 can be arranged. As a result, the number of bonding pads 2 comprised in each of the bonding sub-regions separated by the dummy pads 3 is small, which can improve the efficiency of searching for the bonding pad with the specific serial number.

The number of bonding pads comprised in each bonding sub-region 4 can be the same. When the staff search for the bonding pad 2 with the specific serial number, since the number of bonding pads 2 comprised in each bonding sub-region 4 is the same, the staff can more rapidly determine the bonding sub-region 4 in which the bonding pad 2 with the specific serial number is located, thereby improving the troubleshooting speed and saving the troubleshooting time.

Each dummy pad 3 has a label 5. The label 5 can indicate a variety of contents. The label 5 can be used for indicating the number of bonding pads 2 comprised in the bonding sub-region 4 corresponding to the dummy pad 3. The staff can rapidly know via the label 5 the number of bonding pads 2 comprised in the bonding sub-region 4 corresponding thereto. For example, a dummy pad 3 is provided every 40 bonding pads 2, so the label 5 of each dummy pad 3 can be 40. In this way, the staff can rapidly know via the label of the dummy pad 3 the number of bonding pads 2 comprised in each bonding sub-region 4, thereby improving the efficiency of troubleshooting.

The label 5 can also be used for indicating other contents. The label 5 can be used for indicating a serial number of a bonding sub-region 4 corresponding to the dummy pad 3. For example, a dummy pad 3 is provided every 40 bonding pads 2, so the label 5 of the first dummy pad can be 40, the label 5 of the second dummy pad can be 80, the label 5 of the third dummy pad can be 120, and so on. With the label 5 of the dummy pad 3, a serial number of a bonding sub-region 4 corresponding to the dummy pad 3 can be rapidly determined, and thus the efficiency of troubleshooting can be improved.

The number of bonding pads 2 comprised in each bonding sub-region 4 can be 40-50. The bonding pads 2 comprised in the bonding region 1 of the array substrate generally can be 300-400, so when every 40-50 bonding pads 2 are separated into one bonding sub-region 4, not only can the troubleshooting time be reduced, but also the influence of the dummy pads 3 on the display effect can be decreased, which improves the practicality of the array substrate.

The plurality of bonding pads 2 can be arranged sequentially in a plurality of horizontal rows parallel with each other, the dummy pad in each horizontal row and the corresponding dummy pads in other horizontal rows being located in a same vertical column. Since the dummy pad in each horizontal row and the corresponding dummy pads in other horizontal rows are located in the same vertical column, the influence of the dummy pads on the display effect can be decreased.

In another exemplary embodiment, this disclosure further provides a display panel, comprising any array substrate mentioned above.

This disclosure provides a display panel for enabling the staff to rapidly find a bonding pad with a specific serial number within a bonding region of the array substrate. In related technologies, when the staff need to search for a bonding pad with a specific serial number within a bonding region of the array substrate, they usually have to count from the first bonding pad. This not only makes the troubleshooting procedure laborious and time-consuming, but also easily gives rise to counting errors, thereby resulting in a low efficiency of troubleshooting. The display panel provided in this disclosure comprises an array substrate, the array substrate comprising: a substrate, the substrate having a bonding region on one side, the bonding region comprising a plurality of bonding pads arranged in order, wherein at least one dummy pad is provided in a first position of the bonding pads, the at least one dummy pad dividing the bonding region into a plurality of bonding sub-regions, each bonding sub-region comprising a plurality of bonding pads. When the staff need to search for a bonding pad with a specific serial number, they can first determine the bonding sub-region in which the bonding pad with the specific serial number is located, and then count within the bonding sub-region. This decreases the workload for counting, and thus reduces the time the staff spend searching for the bonding pad with the specific serial number within the bonding region of the array substrate and improves the efficiency of troubleshooting.

What is described above is only specific embodiments of this disclosure, but the protection scope of this disclosure is not limited thereto. Any variation or substitution easily conceivable within the technical scope disclosed in this disclosure for a skilled person who is familiar with this technical field shall fall within the protection scope of this disclosure. Therefore, the protection scope of this disclosure shall be subject to the protection scope of the appended claims.

What is claimed is:

1. An array substrate, comprising:
a substrate, the substrate having a binding region on one side, the binding region comprising a plurality of binding pads arranged in order, wherein at least one dummy pad is provided in a first position of the binding pads, the at least one dummy pad dividing the binding region into a plurality of binding sub-regions, each binding sub-region comprising a plurality of binding pads, the at least one dummy pad has a label, and the label is used for indicating the number of binding pads comprised in a binding sub-region corresponding to the dummy pad.

2. The array substrate according to claim 1, wherein, the number of binding pads comprised in each binding sub-region is the same.

3. The array substrate according to claim 1, wherein, the number of binding pads comprised in each binding sub-region is 40-50.

4. The array substrate according to claim 1, wherein, the plurality of binding pads are arranged sequentially in a plurality of horizontal rows parallel with each other, the dummy pad in each horizontal row and the corresponding dummy pads in other horizontal rows being located in a same vertical column.

5. A display panel, comprising:
the array substrate according to claim 1.

6. The display panel according to claim 5, wherein, the number of binding pads comprised in each binding sub-region is the same.

7. The display panel according to claim 5, wherein, the number of binding pads comprised in each binding sub-region is 40-50.

8. The display panel according to claim 5, wherein,
the plurality of binding pads are arranged sequentially in a plurality of horizontal rows parallel with each other, the dummy pad in each horizontal row and the corresponding dummy pads in other horizontal rows being located in a same vertical column.

9. An array substrate, comprising:
a substrate, the substrate having a binding region on one side, the binding region comprising a plurality of binding pads arranged in order, wherein at least one dummy pad is provided in a first position of the binding pads, the at least one dummy pad dividing the binding region into a plurality of binding sub-regions, each binding sub-region comprising a plurality of binding pads, the at least one dummy pad has a label, and the label is used for indicating a serial number of a binding sub-region corresponding to the dummy pad.

10. The array substrate according to claim 9, wherein, the number of binding pads comprised in each binding sub-region is the same.

11. The array substrate according to claim 9, wherein, the number of binding pads comprised in each binding sub-region is 40-50.

12. The array substrate according to claim 9, wherein,
the plurality of binding pads are arranged sequentially in a plurality of horizontal rows parallel with each other, the dummy pad in each horizontal row and the corresponding dummy pads in other horizontal rows being located in a same vertical column.

13. A display panel, comprising:
the array substrate according to claim 9.

14. The display panel according to claim 13, wherein, the number of binding pads comprised in each binding sub-region is the same.

15. The display panel according to claim 13, wherein, the number of binding pads comprised in each binding sub-region is 40-50.

16. The display panel according to claim 13, wherein,
the plurality of binding pads are arranged sequentially in a plurality of horizontal rows parallel with each other, the dummy pad in each horizontal row and the corresponding dummy pads in other horizontal rows being located in a same vertical column.

* * * * *